US011405114B1

(12) United States Patent
Bottacchi

(10) Patent No.: US 11,405,114 B1
(45) Date of Patent: Aug. 2, 2022

(54) AUTOMATIC POWER CONTROL FOR AN OPTICAL RECEIVER

(71) Applicant: Lumentum Operations LLC, San Jose, CA (US)

(72) Inventor: Stefano Bottacchi, Milan (IT)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 17/199,170

(22) Filed: Mar. 11, 2021

Related U.S. Application Data

(60) Provisional application No. 63/144,239, filed on Feb. 1, 2021.

(51) Int. Cl.
*H04B 10/06* (2006.01)
*H04B 10/61* (2013.01)
*H03G 3/30* (2006.01)
*H03F 3/45* (2006.01)

(52) U.S. Cl.
CPC ....... *H04B 10/616* (2013.01); *H03F 3/45475* (2013.01); *H03G 3/30* (2013.01)

(58) Field of Classification Search
CPC .............. H04B 10/616; H04B 10/6931; H04B 10/671; H04B 10/672; H04B 10/693; H04B 10/40; H04B 10/07955; H04B 10/0799; H04B 10/0797; H04B 10/07957; H04B 10/2507

USPC ....... 398/202, 204, 205, 206, 207, 208, 209, 398/210, 212, 213, 214, 135, 136, 158, 398/159, 33, 38, 25
See application file for complete search history.

(56) References Cited

U.S. PATENT DOCUMENTS

| | | | | |
|---|---|---|---|---|
| 7,936,999 | B1 * | 5/2011 | Hawryluck | H04B 10/60 398/206 |
| 10,404,400 | B2 * | 9/2019 | Chen | H04B 10/40 |
| 2013/0343751 | A1 * | 12/2013 | Mamyshev | H04B 10/61 398/38 |

* cited by examiner

*Primary Examiner* — Hanh Phan
(74) *Attorney, Agent, or Firm* — Harrity & Harrity, LLP

(57) ABSTRACT

An optical receiver includes an optical amplifier that is optically connected to a local oscillator (LO) and a plurality of optical hybrid mixers of the optical receiver and that is electrically connected to a controller. The optical amplifier is configured to receive an optical LO signal from the LO, receive a voltage value associated with an optical input signal of the optical receiver, control a power of the optical LO signal based on the voltage value, and provide, after adjusting the power of the optical LO signal, the optical LO signal to the plurality of optical hybrid mixers. The controller, is configured to determine the voltage value associated with the optical input signal and cause the voltage value to be provided to the optical amplifier.

20 Claims, 6 Drawing Sheets

AUTOMATIC POWER CONTROL FOR AN OPTICAL RECEIVER

CROSS-REFERENCE TO RELATED APPLICATION

This Patent Application claims priority to U.S. Provisional Patent Application No. 63/144,239, filed on Feb. 1, 2021, and entitled "AUTOMATIC POWER CONTROL FOR COHERENT PHOTORECEIVERS." The disclosure of the prior Application is considered part of and is incorporated by reference into this Patent Application.

TECHNICAL FIELD

The present disclosure relates generally to controlling an optical receiver and more specifically to using an automatic power control (APC) mode to control the optical receiver.

BACKGROUND

An optical receiver may be designed to receive light as an input signal and convert one or more wavelength channels, included in the input signal, to one or more respective electrical signals. This functionality can be provided by, for example, an optical receiver that includes an integrated optics circuit, a set of photodetectors (PDs), and a set of transimpedance amplifiers (TIAs). In an example operation, input light is received (via an optical fiber) at the integrated optics circuit. The integrated optics circuit separates the input light into a group of wavelength channels. Next, each wavelength channel is coupled to a respective PD of the set of PDs, which converts the wavelength channel from an optical signal to an electrical current. The current signal is then provided to a respective TIA of the set of TIAs, which converts the current signal to a voltage signal, and outputs the voltage signal (e.g., for further signal processing, as an output of the optical receiver, and/or the like).

SUMMARY

In some implementations, an optical receiver includes an optical amplifier connected to a local oscillator (LO) and a plurality of optical hybrid mixers of the optical receiver, wherein the optical amplifier is configured to: receive an optical LO signal from the LO; receive a voltage value associated with an optical input signal of the optical receiver; adjust a power of the optical LO signal based on the voltage value; and provide, after adjusting the power of the optical LO signal, the optical LO signal to the plurality of optical hybrid mixers.

In some implementations, an optical receiver includes an optical amplifier optically connected to an LO and a plurality of optical hybrid mixers of the optical receiver, wherein the optical amplifier is configured to: receive an optical LO signal from the LO, receive a voltage value associated with an optical input signal of the optical receiver, control a power of the optical LO signal based on the voltage value, and provide, after adjusting the power of the optical LO signal, the optical LO signal to the plurality of optical hybrid mixers; and a controller, configured to: determine the voltage value associated with the optical input signal; and cause the voltage value to be provided to the optical amplifier.

In some implementations, a method includes receiving, by a controller of an optical receiver, a plurality of optical signal strength values associated with an optical input signal from a plurality of transimpedance amplifiers (TIAs) of the optical receiver; processing, by the controller, the plurality of optical signal strength values to determine a representative optical signal strength value; determining, by the controller, whether the representative optical signal strength value satisfies an optical signal strength threshold; generating, by the controller and based on determining whether the representative optical signal strength value satisfies the optical signal strength threshold, a control signal, wherein the control signal indicates, when the representative optical signal strength value satisfies the optical signal strength threshold, that the optical receiver is to be controlled using an automatic gain control (AGC) mode, or wherein the control signal indicates, when the representative optical signal strength value does not satisfy the optical signal strength threshold, that the optical receiver is to be controlled using an automatic power control (APC) mode; and causing, by the controller and based on the control signal, adjustment of a power of an optical LO signal associated with the optical receiver.

DETAILED DESCRIPTION

Figure 1:
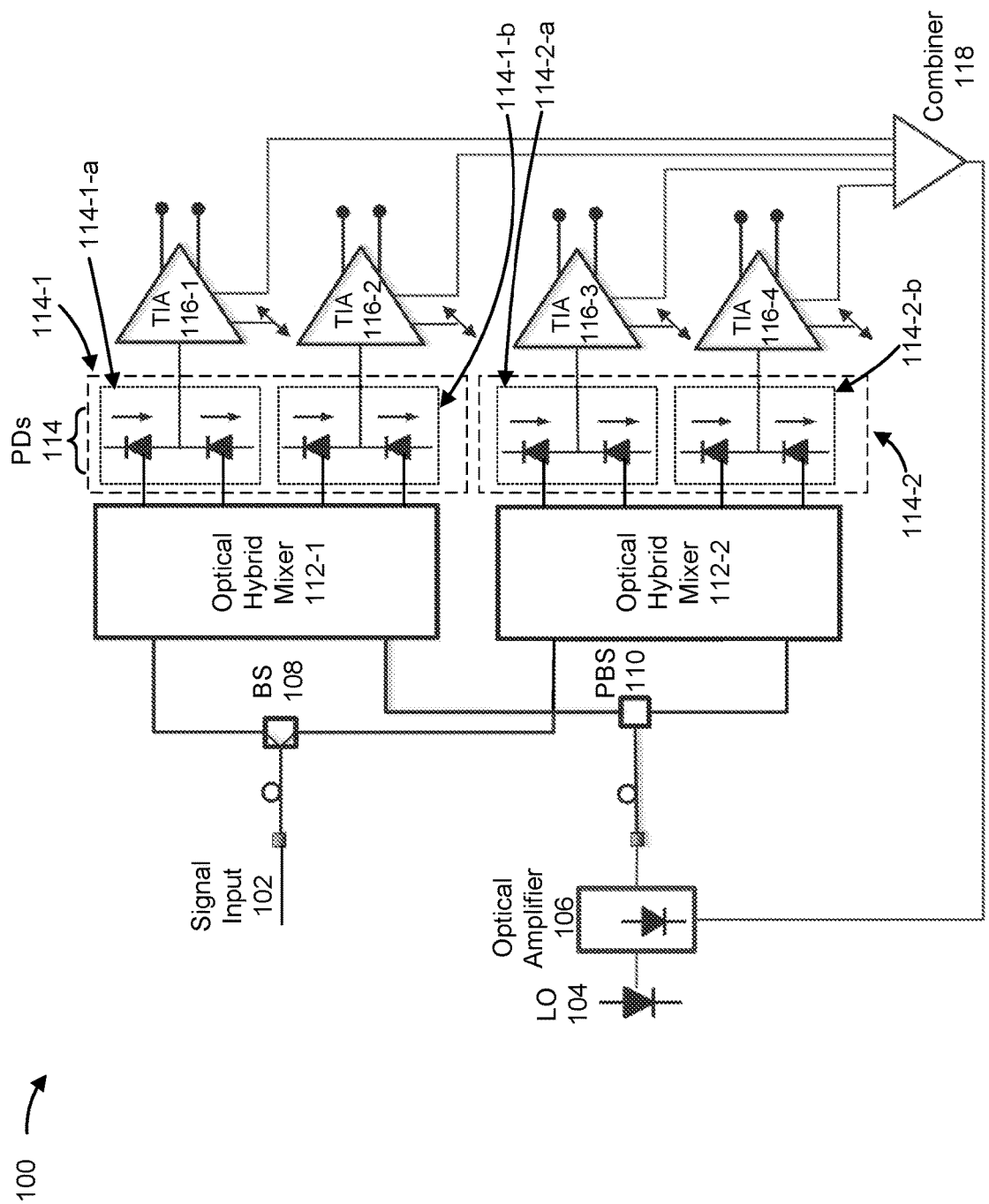
FIG. 1 is a diagram of an example optical device described herein.

The following detailed description of example implementations refers to the accompanying drawings. The same reference numbers in different drawings may identify the same or similar elements.

A conventional optical receiver (e.g., a coherent quadrature amplitude modulation (QAM) optical receiver) uses an automatic gain control (AGC) mode to maintain a constant amplitude of an output signal of the conventional optical receiver. Using the AGC mode, the conventional optical receiver fixes an optical power of an optical local oscillator (LO) signal generated by an LO of the conventional optical receiver and automatically adjusts a transimpedance associated with a transimpedance amplifier (TIA) of the conventional optical receiver. However, shot noise associated with the optical LO signal is proportional to the optical power of the optical LO signal, and TIA noise associated with the TIA (e.g., input noise generated by the TIA) has an inverse relationship with transimpedance (and therefore has a positive relationship with the optical power of the optical LO signal in the conventional optical receiver). Consequently, high LO power creates high shot noise and high TIA noise. The conventional optical receiver typically operates with a constant, maximum optical power of the optical LO signal, which thereby creates shot noise and TIA noise that impacts a sensitivity of the conventional optical receiver (e.g., by affecting an amount of transimpedance that can be controlled using the AGC mode). This also degrades a bit error rate (BER) performance of the conventional coherent optical receiver.

Some implementations described herein provide an optical receiver (e.g., a coherent optical receiver) that uses an automatic power control (APC) mode to control the optical receiver (e.g., to maintain a constant amplitude of an electrical output signal of the optical receiver). The optical receiver, using the APC mode, fixes a set of TIAs of the optical receiver to have a constant transimpedance and uses an optical amplifier of the optical receiver to adjust a power (e.g., an optical power) of an optical LO signal generated by an LO of the optical receiver. Accordingly, the optical receiver, when using the APC mode, causes the power of the optical LO signal to vary and therefore be less than a maximum power of the optical LO signal for one or more periods of operation of the optical receiver (as opposed to causing, when using the AGC mode, the power of the optical LO signal to be fixed at the maximum power of the optical LO signal). The optical receiver therefore reduces an amount of shot noise and TIA noise associated with controlling the optical receiver when using the APC mode as compared to the amount of shot noise and TIA noise associated with controlling a conventional optical receiver using the AGC mode. Accordingly, the optical receiver has an increased sensitivity and provides an improved BER performance as compared to the conventional optical receiver. Moreover, due to a reduced power of the optical LO signal, using the APC mode improves a durability of the optical receiver (e.g., with respect to environmental conditions and aging of components of the optical receiver) as compared to that of a conventional optical receiver.

Further, the APC mode requires a constant, fixed transimpedance of the set of TIAs, which reduces a complexity of a design of each TIA of the optical receiver (as compared to that of a TIA of a conventional optical receiver that has an adjustable transimpedance). Moreover, this reduces a size of the TIA, which reduces a complexity and a cost associated with designing, manufacturing, and maintaining the TIA. Further, a reduced input dynamic range and a constant, fixed transimpedance of the TIA reduces a power consumption of the TIA. Accordingly, the set of TIAs of the optical device can support a high bandwidth (e.g., 96/128 Gbaud) and a high TIA linearity (e.g., 128 QAM).

Some implementations described herein provide a loop controller of an optical receiver. The loop controller may be configured to receive, from the set of TIAs of the optical receiver, optical signal strength values that indicate a power (e.g., an optical power) of an optical input signal of the optical receiver. Based on the optical signal strength values, the loop controller may cause the optical receiver to be controlled using the AGC mode or the APC mode. Accordingly, the loop controller may allow for the optical receiver to provide a preferred performance (e.g., in terms of shot noise, TIA noise, sensitivity, or BER performance, among other examples) based on the power of the optical input signal.

FIG. 1 is a diagram of an example optical device 100 (e.g., an optical receiver) described herein. The optical device 100 may be controlled using an automatic power control (APC) mode, as further described herein. As shown in FIG. 1, the optical device 100 may include a signal input 102, a local oscillator (LO) 104, an optical amplifier 106, a beam splitter (BS) 108, a polarized beam splitter (PBS) 110, a plurality of optical hybrid mixers 112 (shown as optical hybrid mixer 112-1 and optical hybrid mixer 112-2), a plurality of photodetectors (PDs) 114 (shown as eight PDs 114), a plurality of transimpedance amplifiers (TIAs) 116 (shown as TIAs 116-1 through 116-4), and/or a combiner 118.

As further shown in FIG. 1, the signal input 102 may be connected (e.g., optically connected) to the BS 108. The signal input 102 may be configured to receive an optical input signal from an input source, such as an optical fiber (not shown), and to provide the optical input signal (e.g., without amplification) to the BS 108. In some implementations, the BS 108 may be connected (e.g., optically connected) to the plurality of optical hybrid mixers 112. For example, as shown in FIG. 1, the BS 108 may be connected to the optical hybrid mixer 112-1 and the optical hybrid mixer 112-2. The BS 108 may be configured to split the optical input signal (e.g., that the BS 108 received from the signal input 102) into a plurality of optical input signal portions and to respectively provide the plurality of optical input signal portions to the plurality of optical hybrid mixers 112. For example, the BS 108 may split the optical input signal into a first optical input signal portion and a second optical input signal portion and may send the first optical input signal portion to the optical hybrid mixer 112-1 and the second optical input signal portion to the optical hybrid mixer 112-2.

In some implementations, the LO 104 (e.g., an LO laser device) may be configured to generate an optical LO signal. For example, the LO 104 may generate an optical LO signal with a constant, fixed power (e.g., optical power). As further shown in FIG. 1, the LO 104 may be connected (e.g., optically connected) to the optical amplifier 106. The optical amplifier 106 may be a solid-state optical amplifier, a doped fiber optical amplifier, or a semiconductor optical amplifier (SOA), among other examples. In some implementations, the LO 104 and the optical amplifier 106 may be included in an integrated tunable laser assembly (ITLA). The LO 104 may be configured to provide the optical LO signal to the optical amplifier 106. The optical amplifier 106 may be configured to adjust the power of the optical LO signal and to provide the optical LO signal (e.g., after adjusting the power of the optical LO signal) to the PBS 110. Further details regarding adjustment of the power of the optical LO signal by the optical amplifier 106 are described below.

In some implementations, the PBS 110 may be connected (e.g., optically connected) to the plurality of optical hybrid mixers 112. For example, as shown in FIG. 1, the PBS 110 may be connected to the optical hybrid mixer 112-1 and the optical hybrid mixer 112-2. The PBS 110 may be configured to split the optical LO signal (e.g., that the PBS 110 received from the optical amplifier 106) into a plurality of optical LO signal portions that are respectively polarized and to provide the plurality of optical LO signal portions to the plurality of optical hybrid mixers 112. For example, the PBS 110 may split the optical LO signal into a first optical LO signal portion and a second optical LO signal portion and may send the first optical LO signal portion to the optical hybrid mixer 112-1 and the second optical LO signal portion to the optical hybrid mixer 112-2.

In some implementations, an optical hybrid mixer 112, of the plurality of optical hybrid mixers 112, may be connected (e.g., optically connected) to a set of PDs 114 of the plurality of PDs 114. For example, as shown in FIG. 1, the optical hybrid mixer 112-1 may be connected to a first set of PDs 114-1 (e.g., the top four PDs 114 shown in FIG. 1), and the optical hybrid mixer 112-2 may be connected to a second set of PDs 114-2 (e.g., the bottom four PDs 114 shown in FIG. 1). An optical hybrid mixer 112, of the plurality of optical hybrid mixers 112, may be configured to mix an optical input signal portion (e.g., that the optical hybrid mixer 112 received from the BS 108) and an optical LO signal portion (e.g., that the optical hybrid mixer 112 received from the PBS 110) into a mixed optical output signal and to provide the mixed optical output signal to a set of PDs 114 connected to the optical hybrid mixer 112. For example, the optical hybrid mixer 112-1 may mix the first optical input signal portion provided by the BS 108 and the first optical LO signal portion provided by the PBS 110 into a first mixed optical output signal and may provide the first mixed optical output signal to the first set of PDs 114-1. As another example, the optical hybrid mixer 112-2 may mix the second optical input signal portion provided by the BS 108 and the second optical LO signal portion provided by the PBS 110 into a second mixed optical output signal and may provide the second mixed optical output signal to the second set of PDs 114-2.

In some implementations, a set of PDs 114 may include multiple subsets of PDs 114, where a subset of PDs 114 (e.g., a subset of two PDs 114) is connected (e.g., optically connected) to an optical hybrid mixer 112. For example, as shown in FIG. 1, the set of PDs 114-1 may include a subset of PDs 114-1-*a* and a subset of PDs 114-1-*b* that are connected to the optical hybrid mixer 112-1, and the set of PDs 114-2 may include a subset of PDs 114-2-*a* and a subset of PDs 114-2-*b* that are connected to the optical hybrid mixer 112-2. Accordingly, a PD 114, of a subset of PDs 114, may be configured to receive a portion of a mixed optical output signal provided to the subset of PDs 114 by the optical hybrid mixer 112. For example, a first PD 114 of the subset of PDs 114-1-*a* may receive a portion of the first mixed optical output signal provided to the set of PDs 114-1 by the optical hybrid mixer 112-1. As another example, a second PD 114 of the subset of PDs 114-2-*b* may receive a portion of the second mixed optical output signal provided to the set of PDs 114-2 by the optical hybrid mixer 112-2.

A subset of PDs 114 may be connected (e.g., electrically connected) to a TIA 116, of the plurality of TIAs 116. For example, as shown in FIG. 1, the subset of PDs 114-1-*a* may be connected to the TIA 116-1, the subset of PDs 114-1-*b* may be connected to the TIA 116-2, the subset of PDs 114-2-*a* may be connected to the TIA 116-3, and the subset of PDs 114-2-*b* may be connected to the TIA 116-4. Accordingly, a PD 114, of a subset of PDs 114, may be configured to convert a mixed optical output signal portion (e.g., that was provided to the PD 114 by an optical hybrid mixer 112) to an electrical output signal and to provide the electrical output signal to a TIA 116, of the plurality of TIAs 116, that is connected to the PD 114. For example, the first PD 114, of the subset of PDs 114-1-*a*, may convert the portion of the first mixed optical output signal to a first electrical output signal and may provide the first electrical output signal to the TIA 116-1. As another example, the second PD 114, of the subset of PDs 114-1-*b*, may convert the portion of the second mixed optical output signal to a second electrical output signal and may provide the second electrical output signal to the TIA 116-3.

The plurality of TIAs 116 may be connected (e.g., electrically connected) to a processing component (not shown in FIG. 1), such as a digital signal processor (DSP). A TIA 116, of the plurality of TIAs 116, may be configured to amplify an electrical output signal (e.g., that the TIA 116 received from a PD 114) and may provide the electrical output signal to the processing component for processing. For example, the TIA 116-1 may receive the first electrical output signal from the first PD 114, of the subset of PDs 114-1-*a*, may amplify the first electrical output signal, and may provide the first electrical output signal to a DSP for processing. As another example, the TIA 116-3 may receive the second electrical output signal from the second PD 114, of the subset of PDs 114-2-2, may amplify the second electrical output signal, and may provide the second electrical output signal to the DSP for processing.

In some implementations, the plurality of TIAs 116 may be respectively connected (e.g., electrically connected) to the combiner 118. For example, as shown in FIG. 1, the TIA 116-1, the TIA 116-2, the TIA 116-3, and the TIA 116-4, are each connected to the combiner 118. A TIA 116, of the plurality of TIAs 116, may be configured to provide a voltage value associated with an electrical output signal (e.g., that the TIA 116 received from a PD 114) to the combiner 118. For example, the TIA 116-1 may determine a peak detected voltage (also referred to as a PKD) of the first electrical output signal (e.g., that the TIA 116-1 received from the first PD 114 of the subset of PDs 114-1-*a*) and may send a first voltage value indicating the peak detected voltage of the first electrical output signal to the combiner 118. As another example, the TIA 116-3 may determine a peak detected voltage of the second electrical output signal (e.g., that the TIA 116-3 received from the second PD 114 of the subset of PDs 114-2-*b*) and may send a second voltage value indicating the peak detected voltage of the second electrical output signal to the combiner 118.

The combiner 118 may be configured to receive a plurality of voltage values from the plurality of TIAs 116. For example, the combiner 118 may receive the first voltage value from the TIA 116-1, the second voltage value from the TIA 116-3, a third voltage value from the TIA 116-2, and so on. The combiner 118 may be configured to process the plurality of voltage values to determine a representative voltage value. For example, the combiner 118 may determine that the representative voltage value is an average (e.g., a mean or a weighted average), a median, a maximum, or a minimum of the plurality of voltage values.

As shown in FIG. 1, the combiner 118 may be connected (e.g., electrically connected) to the optical amplifier 106. In some implementations, the combiner 118 may be configured to provide the representative voltage value to the optical amplifier 106. The optical amplifier 106 may be configured to adjust the power of the optical LO signal based on the representative voltage value (e.g., that was received by the optical amplifier 106 from the combiner 118). For example, when the representative voltage value satisfies (e.g., is greater than or equal to) a first voltage value threshold, the optical amplifier 106 may adjust the power of the optical LO signal to cause the power of the optical LO signal to not satisfy (e.g., be less than) a first power threshold. As an additional, or alternative, example, when the representative voltage value does not satisfy (e.g., is less than) a second voltage value threshold, the optical amplifier 106 may adjust the power of the optical LO signal to cause the power of the optical LO signal to satisfy (e.g., be greater than or equal to) a second power threshold. In this way, the optical amplifier 106 may be configured to reduce the power of the optical LO signal when the representative voltage value is high and/or to increase the power of the optical LO when the representative voltage value is low. Accordingly, the optical amplifier 106 may be configured to cause, based on the representative voltage value, the optical LO signal to have a particular power or a particular power range. Additionally, or alternatively, while the provided examples illustrate discrete control of the power of the optical LO signal, contemplated implementations include continuous control of the power of the optical LO signal. For example, the optical amplifier 106 may be configured to cause, based on a continuously changing representative voltage value, the optical LO signal to have a to have a continuously changing power or power range. In this way, the optical device 100 may be controlled using the APC mode.

After adjusting the power of the optical LO signal to facilitate control of the optical device 400 using the APC mode, the optical amplifier 106 may provide the optical LO signal (e.g., after adjusting the power of the optical LO signal) to the PBS 110. The optical LO signal may then be processed as described above.

As indicated above, FIG. 1 is provided merely as an example. Other examples are possible and may differ from what was described with regard to FIG. 1.

Figure 2:
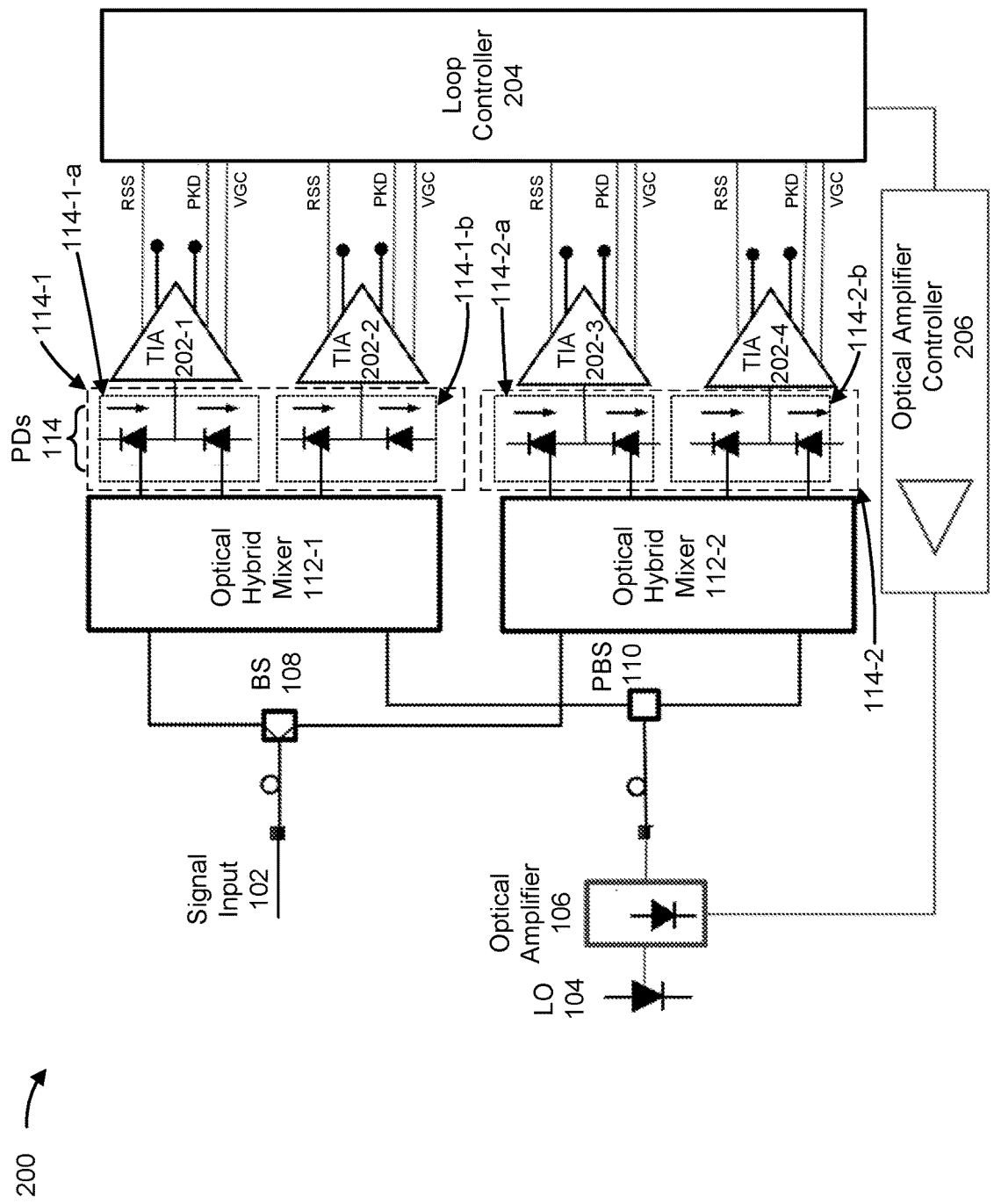
FIG. 2 is a diagram of an example optical device described herein.

FIG. 2 is a diagram of an example optical device 200 (e.g., an optical receiver) described herein. The optical device 200 may be controlled using an automatic power control (APC) mode and/or an automatic gain control (AGC) mode, as further described herein. As shown in FIG. 2, the optical device 200 may include a signal input 102, a local oscillator (LO) 104, an optical amplifier 106, a beam splitter (BS) 108, a polarized beam splitter (PBS) 110, a plurality of optical hybrid mixers 112 (shown as optical hybrid mixer 112-1 and optical hybrid mixer 112-2), and/or a plurality of photodetectors (PDs) 114 (shown as eight PDs 114), as described herein in relation to FIG. 1. As further shown in FIG. 2, the optical device may include a plurality of transimpedance amplifiers (TIAs) 202 (shown as TIAs 202-1 through 202-4), a loop controller 204, and/or an optical amplifier controller 206.

As described above in relation to FIG. 1, the signal input 102 may receive an optical input signal from an input source and may provide the optical input signal (e.g., without amplification) to the BS 108, which may split the optical input signal into a plurality of optical input signal portions and may provide the plurality of optical input signal portions to the plurality of optical hybrid mixers 112. The LO 104 may generate an optical LO signal and may provide the optical LO signal to the optical amplifier 106. In some implementations, the optical amplifier 106 may adjust the power of the optical LO signal (as further described below) and may provide the optical LO signal (e.g., after adjusting the power of the optical LO signal) to the PBS 110, which may split the optical LO signal into a plurality of optical LO signal portions that are respectively polarized and may provide the plurality of optical LO signal portions to the plurality of optical hybrid mixers 112.

As further described above in relation to FIG. 1, each of the plurality of optical hybrid mixers 112 may mix an optical input signal portion (e.g., that the optical hybrid mixer 112 received from the BS 108) and an optical LO signal portion (e.g., that the optical hybrid mixer 112 received from the PBS 110) into a mixed optical output signal and may provide the mixed optical output signal to a set of PDs 114 connected to the optical hybrid mixer 112. A PD 114, of a subset of the set of PDs 114, may receive a portion of the mixed optical output signal.

As shown in FIG. 2, a subset of PDs 114 may be connected (e.g., electrically connected) to a TIA 202, of the plurality of TIAs 202. For example, as shown in FIG. 2, the subset of PDs 114-1-a may be connected to the TIA 202-1, the subset of PDs 114-1-b may be connected to the TIA 202-2, the subset of PDs 114-2-a may be connected to the TIA 202-3, and the subset of PDs 114-2-b may be connected to the TIA 202-4. Accordingly, a PD 114, of a subset of PDs 114, may be configured to convert a mixed optical output signal portion (e.g., that was provided to the PD 114 by an optical hybrid mixer 112) to an electrical output signal and to provide the electrical output signal to a TIA 202, of the plurality of TIAs 202, that is connected to the PD 114. For example, a first PD 114, of the subset of PDs 114-1-a, may convert a portion of a first mixed optical output signal to a first electrical output signal and may provide the first electrical output signal to the TIA 202-1. As another example, a second PD 114, of the subset of PDs 114-1-b, may convert the portion of the second mixed optical output signal to a second electrical output signal and may provide the second electrical output signal to the TIA 202-3.

The plurality of TIAs 202 may be connected (e.g., electrically connected) to a processing component (not shown in FIG. 2), such as a DSP. A TIA 202, of the plurality of TIAs 202, may be configured to amplify an electrical output signal (e.g., that the TIA 202 received from a PD 114) and may provide the electrical output signal to the processing component for processing. For example, the TIA 202-1 may receive the first electrical output signal from the first PD 114, of the subset of PDs 114-1-a, may amplify the first electrical output signal, and may provide the first electrical output signal to a DSP for processing. As another example, the TIA 202-3 may receive the second electrical output signal from the second PD 114, of the subset of PDs 114-2-b, may amplify the second electrical output signal, and may provide the second electrical output signal to the DSP for processing.

In some implementations, the plurality of TIAs 202 may be respectively connected (e.g., electrically connected) to the loop controller 204. For example, as shown in FIG. 2, the TIA 202-1, the TIA 202-2, the TIA 202-3, and the TIA 202-4, are each connected to the loop controller 204. In some implementations, a TIA 202, of the plurality of TIAs 202, may be configured to provide an optical signal strength value associated with an electrical output signal (e.g., that the TIA 202 received from a PD 114) and/or one or more voltage values associated with the electrical output signal to the loop controller 204. For example, the TIA 202-1 may determine a received signal strength (also referred to as an RSS), a peak detected voltage (also referred to as a PKD), and/or a gain control voltage (also referred to as a VGC) of the first electrical output signal (e.g., that the TIA 202-1 received from the first PD 114 of the subset of PDs 114-1-a). The TIA 202-1 may send a first optical signal strength value indicating the RSS of the first electrical output signal, a first peak voltage value indicating the PKD of the first electrical output signal, and/or a first gain control voltage value indicating the VGC of the first electrical output signal to the loop controller 204. As another example, the TIA 202-3 may determine an RSS, a PKD, and/or a VGC of the second electrical output signal (e.g., that the TIA 202-3 received from the second PD 114 of the subset of PDs 114-2-b). The TIA 202-1 may send a second optical signal strength value indicating the RSS of the second electrical output signal, a second peak voltage value indicating the PKD of the second electrical output signal, and/or a second gain control voltage value indicating the VGC of the second electrical output signal to the loop controller 204.

The loop controller 204 may be configured to receive a plurality of optical signal strength values from the plurality of TIAs 202. For example, the loop controller may receive the first optical signal strength value from the TIA 202-1, the second optical signal strength value from the TIA 202-3, a third optical signal strength value from the TIA 202-2, and so on. The loop controller 204 may be configured to process the plurality of optical signal strength values to determine a representative optical signal strength value. For example, the loop controller 204 may determine that the representative optical signal strength value is an average (e.g., a mean or a weighted average), a median, a maximum, or a minimum of the plurality of optical signal strength values.

Additionally, or alternatively, the loop controller 204 may be configured to receive a plurality of peak voltage values from the plurality of TIAs 202. For example, the loop controller may receive the first peak voltage value from the TIA 202-1, the second peak voltage value from the TIA 202-3, a third peak voltage value from the TIA 202-2, and so on. The loop controller 204 may be configured (e.g., when the optical device 200 is controlled using the APC mode) to process the plurality of peak voltage values to determine a representative peak voltage value. For example, the loop controller 204 may determine that the representative peak voltage value is an average (e.g., a mean or a weighted average), a median, a maximum, or a minimum of the plurality of peak voltage values.

Additionally, or alternatively, the loop controller 204 may be configured to receive a plurality of gain control voltage values from the plurality of TIAs 202. For example, the loop controller may receive the first gain control voltage value from the TIA 202-1, the second gain control voltage value from the TIA 202-3, a third gain control voltage value from the TIA 202-2, and so on. The loop controller 204 may be configured (e.g., when the optical device 200 is controlled using the AGC mode) to process the plurality of gain control voltage values to determine a representative gain control voltage value. For example, the loop controller 204 may determine that the representative gain control voltage value is an average (e.g., a mean or a weighted average), a median, a maximum, or a minimum of the plurality of gain control voltage values.

As shown in FIG. 2, the loop controller 204 may be connected (e.g., electrically connected) to the optical amplifier controller 206. In some implementations, the loop controller 204 may be configured to determine whether the representative optical signal strength value satisfies (e.g., is greater than or equal to) an optical signal strength threshold to determine whether the optical device 200 is to be controlled using the AGC mode or the APC mode. For example, when the loop controller 204 determines that the optical signal strength value satisfies (e.g., is greater than or equal to) the optical signal strength threshold, the loop controller 204 may determine that the optical device 200 is to be controlled using the AGC mode. Accordingly, the loop controller 204 may generate a control signal that indicates that the optical amplifier controller 206 is to not control the optical amplifier 106. Additionally, or alternatively, the loop controller 204 may control the plurality of TIAs 202 using the AGC mode (e.g., in a similar manner as that described above) based on the plurality of plurality of gain control voltage values (e.g., that was received by the loop controller 204 from the plurality of TIAs 202) and/or the representative gain control voltage value (e.g., that was determined by the loop controller 204).

As another example, when the loop controller 204 determines that the optical signal strength value does not satisfy (e.g., is less than) the optical signal strength threshold, the loop controller 204 may determine that the optical device 200 is to be controlled using the APC mode. Accordingly, the loop controller 204 may generate a control signal that indicates that the optical amplifier controller 206 is to control the optical amplifier 106.

The loop controller 204 may be configured to provide the control signal (e.g., that indicates that the optical amplifier controller 206 is to control or not to control the optical amplifier 106) to the optical amplifier controller 206. Additionally, or alternatively, the loop controller 204 may be configured to provide the representative peak voltage value (e.g., that the loop controller 204 determined based on the plurality of peak voltage values received from the plurality of TIAs 202) to the optical amplifier controller 206.

As shown in FIG. 2, the optical amplifier controller 206 may be connected (e.g., electrically connected) to the optical amplifier 106. In some implementations, the optical amplifier controller 206 may be configured to process the control signal to determine whether the optical amplifier controller 206 is to control the optical amplifier 106 (e.g., using the APC mode). For example, the optical amplifier controller 206 may parse the control signal to determine that the optical amplifier controller 206 is to control the optical amplifier 106. Accordingly, the optical amplifier controller 206 may be configured to provide the representative peak voltage value (e.g., that the optical amplifier controller 206 received from the loop controller 204) to the optical amplifier 106 (e.g., to facilitate control of the optical device 200 using the APC mode). Alternatively, the optical amplifier controller 206 may parse the control signal to determine that the optical amplifier controller 206 is to not control the optical amplifier 106. Accordingly, the optical amplifier controller 206 may be configured to provide a default voltage value (e.g., that indicates that the optical device is to be controlled using the AGC mode, as described further below) to the optical amplifier 106 (e.g., to facilitate control of the optical device 200 using the AGC mode).

The optical amplifier 106 may be configured to receive a voltage value (e.g., the representative peak voltage value or the default voltage value) from the optical amplifier controller 206. The optical amplifier 106 may adjust the power of the optical LO signal based on the received voltage value. For example, when the received voltage value satisfies (e.g., is greater than or equal to) a first voltage value threshold, the optical amplifier 106 may adjust the power of the optical LO signal to cause the power of the optical LO signal to not satisfy (e.g., be less than) a first power threshold. As an additional, or alternative, example, when the received voltage value does not satisfy (e.g., is less than) a second voltage value threshold, the optical amplifier 106 may adjust the power of the optical LO signal to cause the power of the optical LO signal to satisfy (e.g., be greater than or equal to) a second power threshold. In this way, the optical amplifier 106 may be configured to reduce the power of the optical LO signal when the received voltage value is high and/or to increase the power of the optical LO when the received voltage value is low. Accordingly, the optical amplifier 106 may be configured to cause, based on the received voltage value, the optical LO signal to have a particular power or a particular power range. Additionally, or alternatively, while the provided examples illustrate discrete control of the power of the optical LO signal, contemplated implementations include continuous control of the power of the optical LO signal. For example, the optical amplifier 106 may be configured to cause, based on a continuously changing representative voltage value, the optical LO signal to have a to have a continuously changing power or power range.

In some implementations, when the received voltage value is the default voltage value (e.g., that indicates that the optical device is to be controlled using the AGC mode), the optical amplifier 106 may cause the optical LO signal to have a particular power (e.g., a high fixed, constant power) to facilitate control of the plurality of TIAs 202 by the loop controller 204 according to the AGC mode. In some implementations, when the received voltage value is the representative peak voltage value (e.g., that indicates that the optical device is to be controlled using the APC mode), the optical amplifier 106 may cause the optical LO signal to have a dynamically changing power to facilitate control of the optical amplifier 106 by the optical amplifier controller 206 according to the APC mode.

After adjusting and/or maintaining the power of the optical LO signal to facilitate control of the optical device 200 using the APC mode or the AGC mode, the optical amplifier 106 may provide the optical LO signal to the PBS 110. The optical LO signal may then be processed as described above.

As indicated above, FIG. 2 is provided merely as an example. Other examples are possible and may differ from what was described with regard to FIG. 2.

Figure 3:
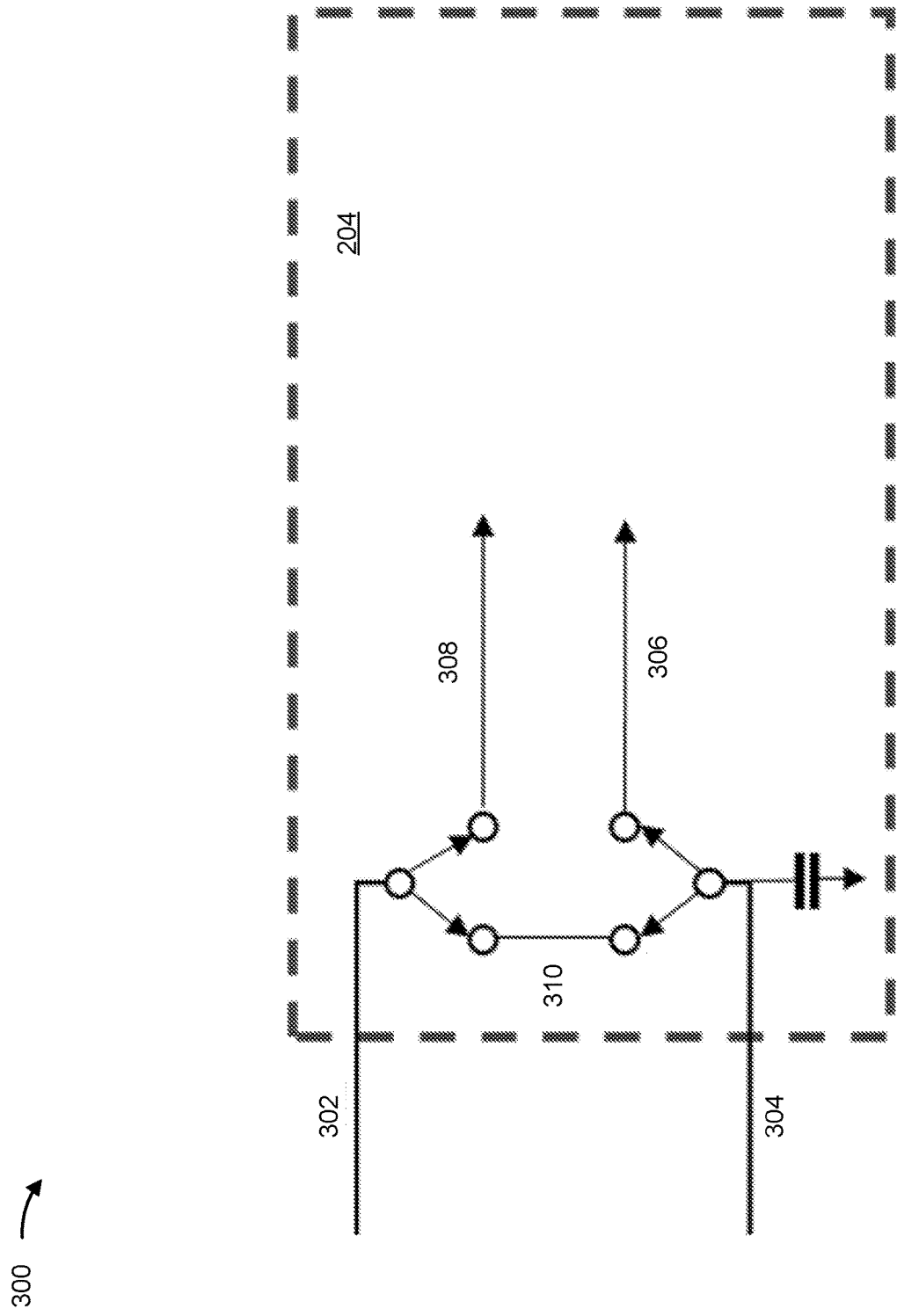
FIG. 3 is a diagram illustrating a portion of a loop controller described herein.

FIG. 3 is a diagram 300 illustrating a portion of the loop controller 204 (e.g., a portion of the loop controller 204 that is associated with a particular TIA 202 of the plurality of TIAs 202). As shown in FIG. 3, the loop controller 204 may be connected (e.g., electrically connected) to a TIA 202 (not shown), of the plurality of TIAs 202, via a first connection 302 and a second connection 304. The first connection 302 may be configured to transmit a voltage value of an electrical output signal, such as a peak detected voltage value (e.g., that indicates a peak detected voltage of the electrical output signal, also referred to as a PKD) from the TIA 202 to the loop controller 204. The second connection 304 may be configured to transmit a different voltage value of the electrical output signal, such as a gain control voltage value (e.g., that indicates a gain control voltage of the electrical output signal, also referred to as a VGC) from the TIA 202 to the loop controller 204. The loop controller 204 may process the peak detected voltage value and the gain control voltage value as described above in relation to FIG. 2.

In some implementations, the loop controller 204 may facilitate calibration of the optical device 200 to allow the optical device 200 to provide an optimal performance when controlled using the APC mode. For example, the loop controller 204 may generate different control signals and/or representative peak voltage values (e.g., to cause a power of the optical LO signal to adjust to particular levels or across different ranges). As shown by reference number 306, the loop controller 204 then may receive and process respective gain control voltage values of the plurality of TIAs 202 to determine respective optimal transimpedance gains of the plurality of TIAs 202 that allow each TIA 202 to provide an optimal amplified electrical output signal when controlled using the APC mode. Accordingly, the loop controller 204 may cause the plurality of TIAs 202 to operate at the respective optical transimpedance gains when the loop controller 204 determines that the optical device is to be controlled using the AGC mode (e.g., as described in relation to FIG. 2).

As shown by reference number 308, the loop controller 204 may control the optical device 200 using the APC mode based on the plurality of peak voltage values provided by the plurality of TIAs 202 (e.g., as described in relation to FIG. 2). As shown by reference number 310, the loop controller 204 may control the optical device 200 using the AGC mode based on the plurality of peak voltage values and the plurality of gain control voltage values provided by the plurality of TIAs 202 (e.g., as described in relation to FIG. 2).

As indicated above, FIG. 3 is provided merely as an example. Other examples are possible and may differ from what was described with regard to FIG. 3.

Figure 4:
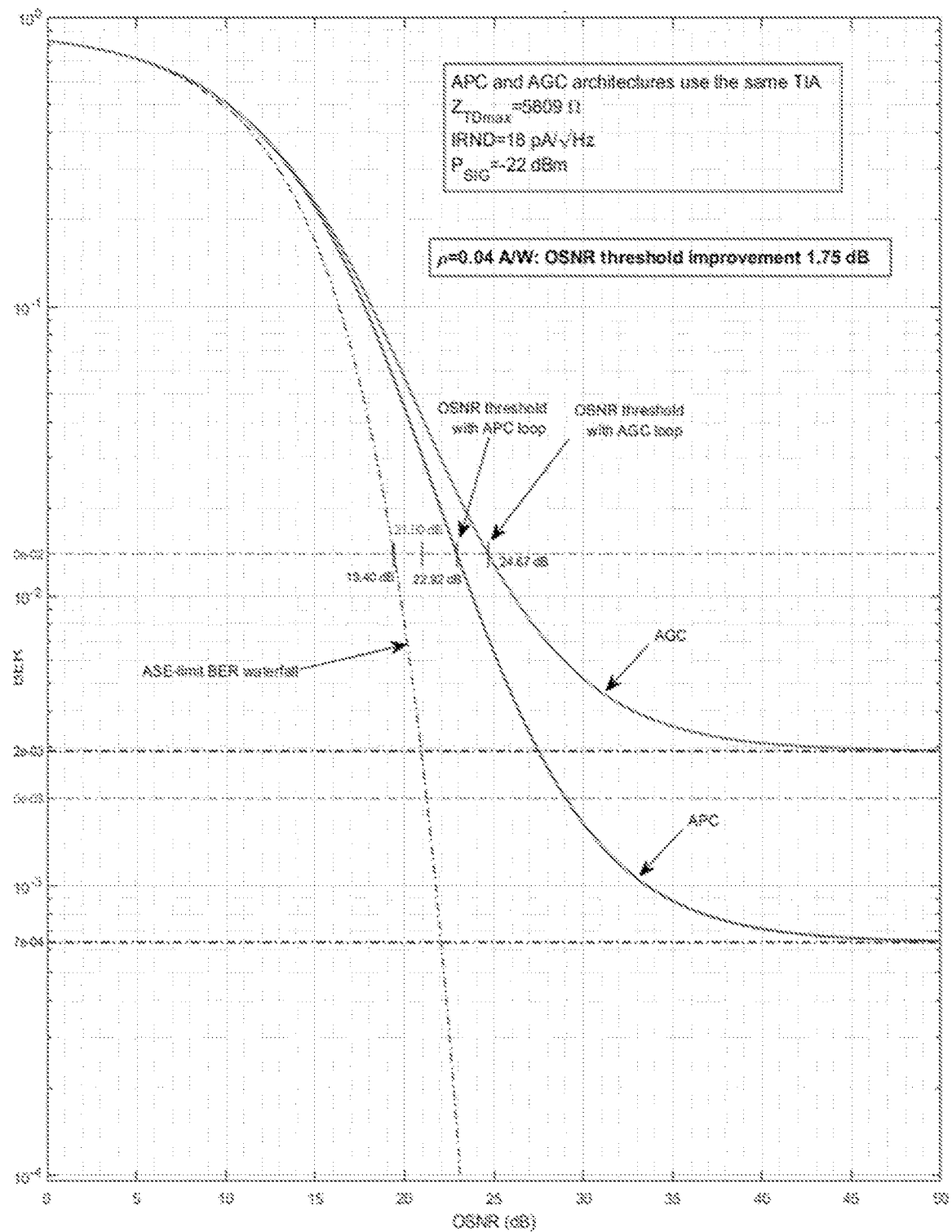
FIG. 4 is a chart illustrating a bit error rate (BER) performance of an example optical device.

FIG. 4 is a chart 400 illustrating a bit error rate (BER) performance of an example optical device (e.g., optical device 100 or optical device 200), such as a 32Gbaud DP-16QAM optical device. The optical device may include a plurality of transimpedance amplifiers (TIAs) (e.g., TIAs 116 or TIAs 202) that each have maximum transimpedance (shown as $Z_{TDmax}$ in FIG. 4) of 5809 ohms and an input referred noise density (shown as IRND in FIG. 4) of 18 pA/√Hz. Further, an optical input signal may have an optical power of −22 dBm.

The optical device may be associated with a signal noise ratio (SNR) that can be determined using the following formula:

$$SNR \propto \rho \left[ \frac{P_{LO} P_{SIG}}{(4q\rho P_{LO} + i_{n,TIA}^2) B_n} \right],$$

where: q is an electron charge, $\rho$ is an effective responsivity (A/W), $P_{LO}$ is a CW power of an LO laser (W), $P_{SIG}$ is an average input signal optical power (W), $i_{n,TIA}$ is an input referred noise power density of the TIA (pA/√Hz), and $B_n$ is a noise n, bandwidth (Hz). $4q\rho P_{LO}$ may be referred to as an LO shot noise.

In a typical case, $\rho=0.06$ A/W and $P_{LO}=20$ mW (13 dBm). The LO shot noise therefore generates a noise current density at a TIA input according to the following formula:

$$4q\rho P_{LO} \approx 28 \frac{pA}{\sqrt{Hz}}.$$

Accordingly, when $$i_{n,TIA} \ll 28 \frac{pA}{\sqrt{Hz}}$$

(e.g., when the LO shot noise is much larger than TIA noise), the SNR is not based on LO power and therefore reaches a constant value the according to the formula:

$$SNR \propto \frac{\rho P_{SIG}}{4q B_n}.$$

Additionally, or alternatively, when $$i_{n,TIA} \gg 28 \frac{pA}{\sqrt{Hz}}$$

(e.g., when the TIA noise is much larger than the LO shot noise), the SNR increases based on LO power according to the formula:

$$SNR \propto \frac{\rho P_{LO} P_{SIG}}{i_{n,TIA}^2 B_n}.$$

Accordingly, in AGC mode, the TIA noise is not constant and may grow monotonically versus LO power.

As shown in FIG. 4, the optical device may have an optical signal noise ratio (OSNR) of approximately 22.92 dB when using the APC mode to produce a BER of $1.40\,e^{-02}$ (e.g., an optimal BER for the optical device). As further shown in FIG. 4, the optical device may have an OSNR of approximately 24.67 dB when using the AGC mode to produce the BER of 1.40 $e^{-02}$. Accordingly, the APC mode provides an approximate 1.75 dB OSNR performance improvement as compared to the AGC mode. Moreover, a BER floor (e.g., approximately 6.27 $e^4$) is lower for the APC mode than a BER floor for the AGC mode (e.g., 2.923 $e^{-03}$). Accordingly, the APC mode provides an improved performance as compared to the AGC mode for this configuration of the optical device and the optical power of the optical input signal.

As indicated above, FIG. 4 is provided merely as an example. Other examples are possible and may differ from what was described with regard to FIG. 4.

Figure 5:
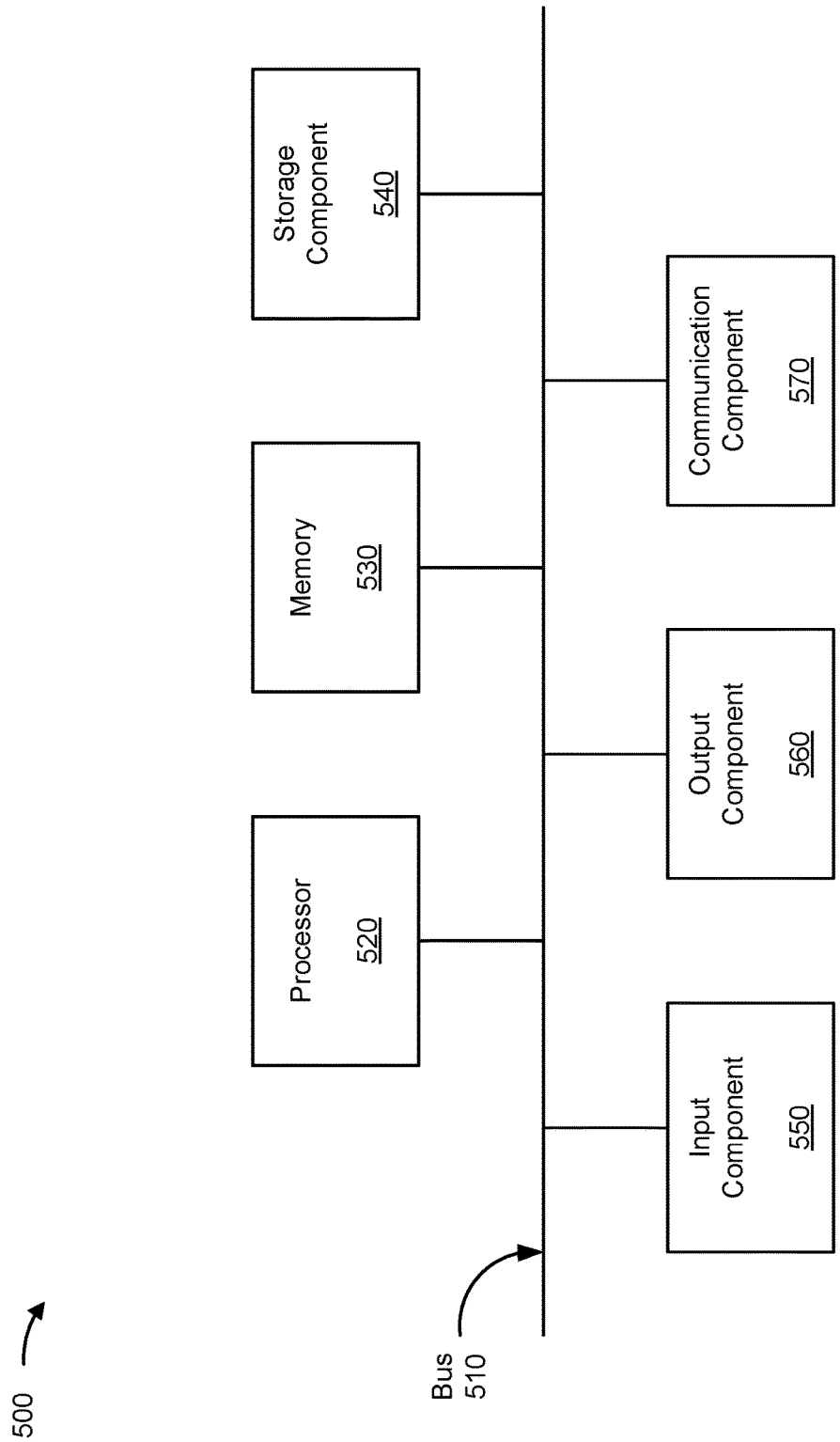
FIG. 5 is a diagram of example components of one or more components of FIG. 2.

FIG. 5 is a diagram of example components of a device 500, which may correspond to the loop controller 204 and/or the optical amplifier controller 206. In some implementations, the loop controller 204 and/or the optical amplifier controller 206 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
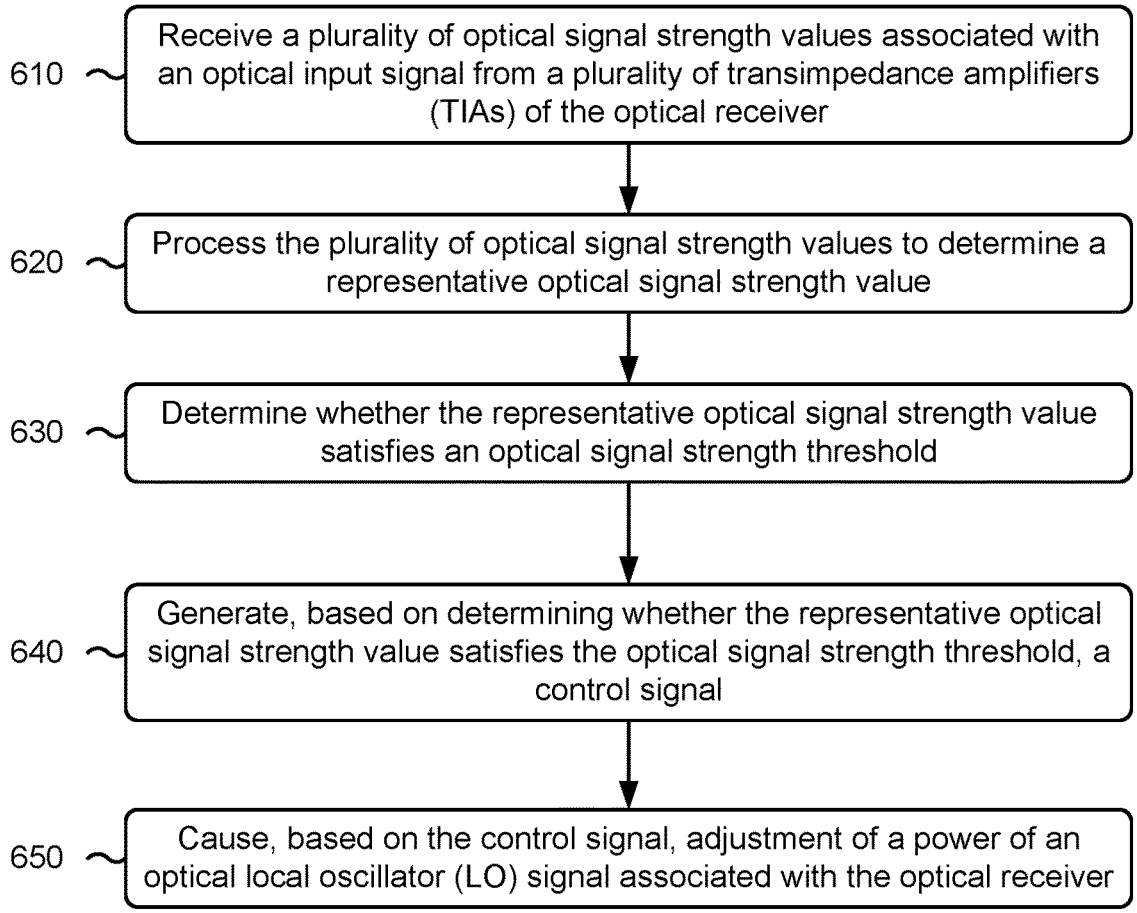
FIG. 6 is a flowchart of an example processes relating to automatic power control (APC) for an optical receiver.

FIG. 6 is a flowchart of an example process 600 associated with automatic power control (APC) for an optical receiver. In some implementations, one or more process blocks of FIG. 6 may be performed by a controller (e.g., loop controller 204). In some implementations, one or more process blocks of FIG. 6 may be performed by another device or a group of devices separate from or including the controller, such as an optical amplifier controller (e.g., optical amplifier controller 206). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include receiving a plurality of optical signal strength values associated with an optical input signal from a plurality of transimpedance amplifiers (TIAs) of the optical receiver (block 610). For example, the controller may receive a plurality of optical signal strength values associated with an optical input signal from a plurality of TIAs of the optical receiver, as described above.

As further shown in FIG. 6, process 600 may include processing the plurality of optical signal strength values to determine a representative optical signal strength value (block 620). For example, the controller may process the plurality of optical signal strength values to determine a representative optical signal strength value, as described above.

As further shown in FIG. 6, process 600 may include determining whether the representative optical signal strength value satisfies an optical signal strength threshold (block 630). For example, the controller may determine whether the representative optical signal strength value satisfies an optical signal strength threshold, as described above.

As further shown in FIG. 6, process 600 may include generating, based on determining whether the representative optical signal strength value satisfies the optical signal strength threshold, a control signal (block 640). For example, the controller may generate, based on determining whether the representative optical signal strength value satisfies the optical signal strength threshold, a control signal, as described above. In some implementations, the control signal indicates, when the representative optical signal strength value satisfies the optical signal strength threshold, that the optical receiver is to be controlled using an automatic gain control (AGC) mode. In some implementations, the control signal indicates, when the representative optical signal strength value does not satisfy the optical signal strength threshold, that the optical receiver is to be controlled using an APC mode.

As further shown in FIG. 6, process 600 may include causing, based on the control signal, adjustment of a power of an optical local oscillator (LO) signal associated with the optical receiver (block 650). For example, the controller may cause, based on the control signal, adjustment of a power of an optical LO signal associated with the optical receiver, as described above. In some implementations, causing the adjustment of the power of the optical LO signal comprises providing the control signal to another component of the optical receiver to cause an optical amplifier of the optical receiver to adjust the power of the optical LO signal.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical receiver, comprising:
   an optical amplifier connected to a local oscillator (LO), a combiner, and a plurality of optical hybrid mixers of the optical receiver, wherein the optical amplifier is configured to:
   receive an optical LO signal from the LO;
   receive a voltage value associated with an optical input signal of the optical receiver;
   adjust a power of the optical LO signal based on the voltage value; and
   provide, after adjusting the power of the optical LO signal, the optical LO signal to the plurality of optical hybrid mixers; and
   wherein the combiner is configured to:
   receive a plurality of voltage values associated with the optical input signal from a plurality of transimpedance amplifiers (TIAs) of the optical receiver;
   process the plurality of voltage values to determine the voltage value; and
   provide the voltage value to the optical amplifier.

2. The optical receiver of claim 1, wherein the optical amplifier is a semiconductor optical amplifier.

3. The optical receiver of claim 1, further comprising an optical amplifier controller connected to the optical amplifier,
   wherein the optical amplifier controller is configured to:
   receive a control signal;
   determine, based on the control signal, that the optical amplifier controller is to control the optical amplifier using an automatic power control (APC) mode; and
   send, to the optical amplifier and based on determining that the controller is to control the optical amplifier using the APC mode, a representative peak voltage value associated with the optical input signal as the voltage value.

4. The optical receiver of claim 1, further comprising an optical amplifier controller connected to the optical amplifier,
   wherein the optical amplifier controller is configured to:
   receive a control signal;
   determine, based on the control signal, that the optical amplifier controller is to control the optical amplifier using an automatic gain control (AGC) mode; and
   send, to the optical amplifier and based on determining that the controller is to control the optical amplifier using the AGC mode, a default voltage value associated with the optical input signal as the voltage value.

5. The optical receiver of claim 1, further comprising a loop controller,
   wherein the loop controller is configured to:
   receive a plurality of optical signal strength values associated with the optical input signal and the plurality of voltage values;

process the plurality of optical signal strength values to
determine a representative optical signal strength
value;
process the plurality of voltage values to determine a
representative voltage value associated with the optical input signal; and
cause the representative voltage value to be provided to
the optical amplifier as the voltage value when the
representative optical signal strength value does not
satisfy an optical signal strength threshold.

6. The optical receiver of claim 5, wherein the loop controller is configured to, when causing the representative voltage value to be provided to the optical amplifier as the voltage value:
generate a control signal that indicates that the optical
receiver is to be controlled using an automatic power
control (APC) mode; and
provide the control signal and the representative voltage
value to an optical amplifier controller of the optical
receiver to cause the optical amplifier controller to
provide the representative voltage value to the optical
amplifier as the voltage value.

7. The optical receiver of claim 1, further comprising a loop controller,
wherein the loop controller is configured to:
receive a plurality of optical signal strength values
associated with the optical input signal;
process the plurality of optical signal strength values to
determine a representative optical signal strength
value; and
cause a default voltage value to be provided to the
optical amplifier as the voltage value when the
representative optical signal strength value satisfies
an optical signal strength threshold.

8. The optical receiver of claim 7, wherein the loop controller is configured to, when causing the default voltage value to be provided to the optical amplifier as the voltage value:
generate a control signal that indicates that the optical
receiver is to be controlled using an automatic gain
control (AGC) mode; and
provide the control signal to an optical amplifier controller of the optical receiver to cause the optical amplifier
controller to provide the default voltage value to the
optical amplifier as the voltage value.

9. An optical receiver, comprising:
an optical amplifier optically connected to a local oscillator (LO) and a plurality of optical hybrid mixers of
the optical receiver, wherein the optical amplifier is
configured to:
receive an optical LO signal from the LO,
receive a voltage value associated with an optical input
signal of the optical receiver,
control a power of the optical LO signal based on the
voltage value, and
provide, after adjusting the power of the optical LO
signal, the optical LO signal to the plurality of
optical hybrid mixers; and
a controller, configured to:
determine the voltage value associated with the optical
input signal, wherein the voltage value is a default
voltage value associated with the optical input signal;
generate a control signal that indicates that the optical
receiver is to be controlled using an automatic gain
control (AGC) mode; and
provide the control signal to another controller of the
optical receiver to cause the other controller to
provide the voltage value to the optical amplifier.

10. The optical receiver of claim 9, wherein the default voltage value is a representative peak voltage value associated with the optical input signal.

11. The optical receiver of claim 9, wherein the controller is configured to, when determining the voltage value:
receive a plurality of peak voltage values associated with
the optical input signal from a plurality of transimpedance amplifiers (TIAs) of the optical receiver; and
process the plurality of peak voltage values to determine
the voltage value.

12. The optical receiver of claim 9, wherein the controller is configured to, when determining the voltage value:
receive another control signal and a representative peak
voltage value associated with the optical input signal
from another controller; and
determine, based on the other control signal, that the
default voltage value is the representative peak voltage
value.

13. The optical receiver of claim 9, wherein the controller is configured to, when determining the voltage value:
receive another control signal from another controller;
and
determine, based on the other control signal, that the
voltage value is the default voltage value.

14. The optical receiver of claim 9, wherein the default voltage value is a representative peak voltage value associated with the optical input signal,
wherein the controller is configured to:
receive another control signal;
determine, based on the other control signal, that the
optical receiver is to be controlled using an automatic power control (APC) mode; and
send, to the optical amplifier and based on determining
that the optical receiver is to be controlled using the
APC mode, the voltage value.

15. The optical receiver of claim 9,
wherein the controller is configured to:
receive another control signal;
determine, based on the other control signal, that the
optical receiver is to be controlled using the AGC
mode; and
send, to the optical amplifier and based on determining
that the optical receiver is to be controlled using the
AGC mode, the voltage value.

16. A method, comprising:
receiving, by a controller of an optical receiver, a plurality
of optical signal strength values associated with an
optical input signal from a plurality of transimpedance
amplifiers (TIAs) of the optical receiver;
processing, by the controller, the plurality of optical signal
strength values to determine a representative optical
signal strength value;
determining, by the controller, whether the representative
optical signal strength value satisfies an optical signal
strength threshold;
generating, by the controller and based on determining
whether the representative optical signal strength value
satisfies the optical signal strength threshold, a control
signal,
wherein the control signal indicates, when the representative optical signal strength value satisfies the
optical signal strength threshold, that the optical
receiver is to be controlled using an automatic gain
control (AGC) mode, or wherein the control signal indicates, when the representative optical signal strength value does not satisfy the optical signal strength threshold, that the optical receiver is to be controlled using an automatic power control (APC) mode; and causing, by the controller and based on the control signal, adjustment of a power of an optical local oscillator (LO) signal associated with the optical receiver, wherein causing the adjustment of the power of the optical LO signal comprises:

providing the control signal to another component of the optical receiver to cause an optical amplifier of the optical receiver to adjust the power of the optical LO signal.

17. The method of claim 16, wherein the other component comprises an optical amplifier controller.

18. The method of claim 16, wherein providing the control signal comprises:

providing the control signal to the other component to cause the other component to provide a default voltage value to the optical amplifier.

19. The method of claim 16, wherein providing the control signal comprises:

providing the control signal to the other component to cause the other component to provide a representative peak voltage value to the optical amplifier.

20. The method of claim 16, wherein the plurality of optical signal strength values comprise a plurality of peak voltage values associated with the optical input signal.

\* \* \* \* \*